United States Patent [19]

Jansen

[11] Patent Number: 4,864,248
[45] Date of Patent: Sep. 5, 1989

[54] AMPLIFIER ARRANGEMENT WITH CONTROLLABLE GAIN

[75] Inventor: Winfrid B. Jansen, Ellerbek, Fed. Rep. of Germany

[73] Assignee: U.S. Philips Corp., New York, N.Y.

[21] Appl. No.: 128,670

[22] Filed: Dec. 4, 1987

[30] Foreign Application Priority Data

Dec. 13, 1986 [DE] Fed. Rep. of Germany ....... 3642620

[51] Int. Cl.$^4$ .......................... H03F 3/45; H03G 3/30
[52] U.S. Cl. ..................................... 330/254; 330/282
[58] Field of Search ............... 330/254, 261, 278, 260, 330/282

[56] References Cited

U.S. PATENT DOCUMENTS 3,909,738  9/1978  Niimi ................................... 330/254

FOREIGN PATENT DOCUMENTS 3522416  1/1987  Fed. Rep. of Germany ...... 330/254

Primary Examiner—Gene Wan
Attorney, Agent, or Firm—Bernard Franzblau

[57] ABSTRACT

An amplifier arrangement with controllable gain comprising two differential amplifiers which are connected in parallel at their inputs and outputs and which have different gain factors which can be varied oppositely. The gain of one of said differential amplifiers is reduced in that a first resistor is connected between its input terminals and a second resistor is connected between at least one of said input terminals and the corresponding input terminal of the other differential amplifier. As a result, the input signal to this amplifier is subject to a voltage division enabling the input swing to be increased.

18 Claims, 1 Drawing Sheet

1

AMPLIFIER ARRANGEMENT WITH CONTROLLABLE GAIN

BACKGROUND OF THE INVENTION

This invention relates to an amplifier arrangement comprising at least two differential amplifiers having different gain factors and having their inputs and outputs coupled to one another, at least the gain of the differential amplifier having the higher gain factor being variable.

An arrangement of this type, which can be used, for example, for the purpose of the gain control in AM receivers, is known from U.S. Pat. No. 3,909,738. In this known arrangement the differential amplifiers are constituted by emitter-coupled transistor pairs. The base and collector terminals of one pair, which constitute the input and the output of the arrangement respectively, are connected directly to the corresponding terminals of the other pair. The different gain factors are obtained in that the emitter terminals of one transistor pair are connected directly to each other and to a direct current source, whereas the emitter terminals of the other transistor pair are connected to each other and to the common direct current source via negative-feedback resistors of equal resistance value. Therefore, the last-mentioned transistor pair has the lower gain factor. By oppositely varying the direct currents applied to the common emitter terminals of the transistor pairs the overall gain can be varied continuously between this lower gain factor and the gain factor of the other transistor pair.

The input swing in the state in which the input signal is, in fact, only amplified by the amplifier comprising the emitter feedback resistors is dictated by the voltage drop across the negative-feedback resistors in the lines to the emitters. The input swing can be extended by increasing the values of these resistors, but in practice this is in conflict with other requirements.

SUMMARY OF THE INVENTION

It is an object of the invention to extend the input swing of an arrangement of the type defined in the opening paragraph in the minimum gain condition.

According to the invention this object is achieved in that a first resistor is arranged between two inputs of the differential amplifier having the lower gain factor and in that a second resistor is arranged between at least one input of said differential amplifier and the corresponding input of the other differential amplifier.

In accordance with the invention the gain of the differential amplifier having the lower gain factor is reduced in that the input voltage is divided between the first resistor and the second resistor or in that the resistors are divided between the inputs of one differential amplifier and the corresponding inputs of the other differential amplifier, the gain reduction being dependent upon the resulting voltage-division factor.

Such a circuit arrangement, preceded by a filter, can be used inter alia in a receiver. In a further embodiment of the invention the arrangement is preceded by a filter which is terminated by an impedance comprising the first and the second resistor. As a result of this, the first and the second resistor cannot produce more noise than the terminating impedance of the filter, which impedance is necessary anyway.

In a further embodiment of the invention the gain (in the minimum-gain condition) can be reduced even further in that negative-feedback resistors are arranged in the lines to the emitters of the transistors of the differential amplifier having the lower gain factor.

BRIEF DESCRIPTION OF THE DRAWING

Embodiments of the invention will now be described in more detail, by way of example, with reference to the accompanying drawing. In the drawing.

DESCRIPTION OF THE PREFERRED EMBODIMENTS

Figure 1:
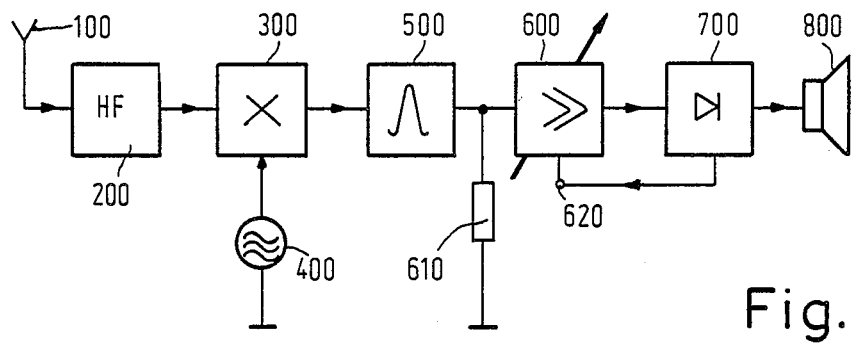
FIG. 1 shows a block diagram of an AM receiver in which the invention can be used.

In the block diagram of an AM radio receiver shown in FIG. 1, the input signal from an aerial 100 is applied to a high-frequency input stage 200, whose output is connected to the input of a mixing stage 300 in which the amplified and filtered high-frequency input signal is mixed with the signal generated by an oscillator 400. A filter 500, which suitably comprises quartz or ceramic resonators and which is terminated with a terminating impedance 610, extracts the I.F. signal produced during mixing and supplies it to an amplifier 600 whose gain is variable by means of a d.c. control voltage on its control input 620. The amplified I.F. signal is applied to a demodulator and low-frequency amplifier unit 700, which generates an audio signal for a loudspeaker 800 and a d.c. control voltage which is applied to the control input 620 for the purpose of automatic gain control.

Figure 2:
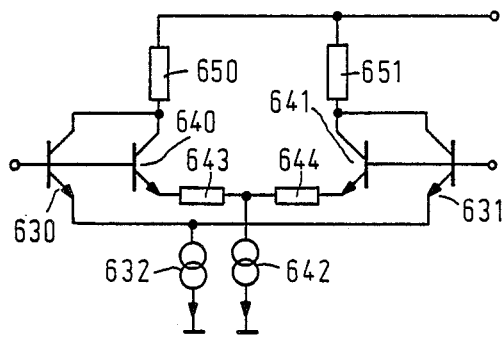
FIG. 2 is the circuit diagram of a known amplfier with controllable gain.

FIG. 2 shows the circuit diagram of a known amplifier which can be used for the I.F. amplifier 600. It comprises a first differential amplifier made up of a first pair of transistors 630 and 631, whose emitter terminals are connected directly to one another and to a common controllable direct current source 632, and a second differential amplifier made up of a second pair of transistors 640 and 641, whose emitter terminals are connected to one another and to a common direct current source 642 via two resistors 643 and 644. The base and collector terminals of the transistors 630 and 640 are connected to each other and the corresponding terminals of the transistors 631 and 641 are also interconnected so that the inputs of the two differential amplifiers are coupled to one another and the outputs of the two differential amplifiers are couple to one another. The input signal is supplied either asymmetrically to one input or symmetrically to both inputs, and the output signal is taken from one or both common collector terminals, which are each connected to a positive supply voltage UB via a resistor 650 and 651 respectively.

By oppositely varying the direct currents supplied by the controllable direct current sources 632 and 642, the gain can be varied between a maximum value dictated by the gain factor of the transistor pair 630, 631 and a minimum value dictated by the gain factor of the transistor pair 640, 641. In the minimum-gain condition, i.e. when the signal gain is in principal dictated by the transistor pair 640, 641, the input swing, i.e. the maximum differential input voltage which can be handled substantially without any distortion, depends on the voltage drop produced across one of the two resistors 643 and 644 by the direct current from the source 642, provided that neither of the transistors 640, 641 is then bottomed.

In principle, the input swing can be increased by increasing the values of the resistors 643, 644. However, in practice such an increase is in conflict with other requirements, for example the requirement of a higher gain.

Figure 3:
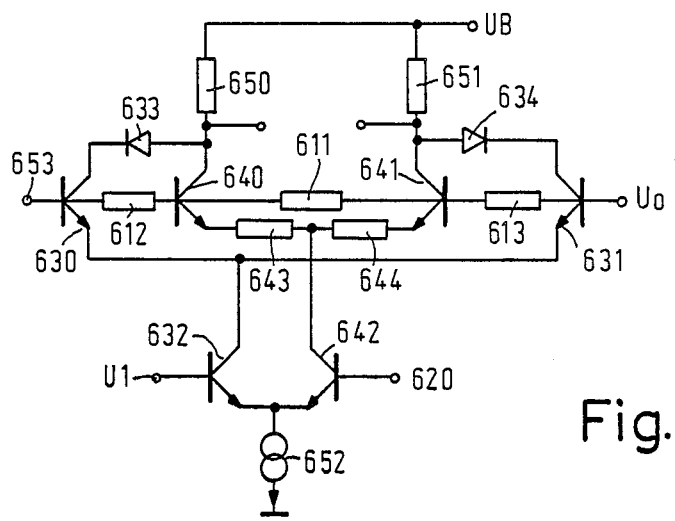
FIG. 3 is the circuit diagram of an amplifier in accordance with the invention.

In FIG. 3, in which identical parts bear the same reference numerals as in FIG. 2, an amplifier in accordance with the invention is shown in which the input swing is increased without increasing the values of the negativefeedback resistor 643 and 644. This arrangement also comprises a first emitter-coupled transistor pair 630, 631, which dictates the maximum gain, and a second emittercoupled transistor pair 640, 641, which determines the minimum gain. The input signal is applied to the transistor pair 640, 641 via a voltage divider comprising a resistor 611 between the bases of the transistors 640 and 641 and resistors 612 and 613 respectively between the bases of the transistors 630, 640 and 631, 641 respectively which are coupled to the same input terminal. As a result of this, the input swing can be increased to the operating voltage, or even beyond this voltage by suitably dimensioning the voltage divider. Since the voltage divider also leads to a reduction in gain, the emitter resistors 643 and 644 my also be dispensed with. It is particularly advantageous if the overall resistance of the voltage divider 611 . . . 613 corresponds to the terminating impedance of the preceding filter, so that the resistor constituting this terminating impedance may be dispensed with. The resistors of the voltage divider then do not introduce any additional noise.

If the arrangement, as in the example of FIG. 1, is operated asymmetrically, i.e. if the input signal is only applied to the input terminal 653 which is coupled to the bases of the transistors 630 and 640, the other input terminal being connected to a constant potential Uo (the resistor 613 connecting the base of the transistor 641 to the constant potential Uo may then also be dispensed with), it is adequate if the input which is at a constant potential be connected to ground for a.c., for example by means of a capacitor, not shown, or if the internal resistance of the direct voltage source supplying the bias voltage Uo be low in comparison with the overall resistance of the voltage divider 611 . . . 613.

In the low-gain condition a diode 633, which is poled in the forward direction between the collector of the transistor 640 and the collector of the transistor 630, prevents the collector-base diode of the transistor 630 from being turned on in the case of a large input signal and thus the input signal or the output signal across the collector resistors 650, 651 from being distorted. In the case of asymmetrical operation this is less likely to occur for the base-collector diode of the transistor 631, but to restore the symmetry it is effective if the collector of said transistor is also connected to the collector of the transistor 641 via a diode 634 poled in the forward direction.

The direct current sources comprise two transistors 632 and 642, whose emitters are connected to one another and to a direct current source 652 and whose collectors are connected to the respective junction points between the emitters of the transistors 630 and 631 and between the resistors 643 and 644. The base of the transistors 632 is connected to a constant potential U1 (smaller than Uo) and the base of the transistor 642 constitutes the control input, to which a control voltage is applied which becomes more positive as the low-frequency amplitude increases. If the control voltage should become more negative at increasing amplitude, the base connections have to be interchanged. The direct current sources 632 and 642 can also be realized in a different way. It is essential only that the output signal of at least the differential amplifier (630, 631) having the higher gain factor can be varied electronically.

In the foregoing the invention has been described for an embodiment comprising two differential amplifiers whose inputs and outputs are coupled to one another. However, the invention may also be applied when more than two differential amplifiers are used; in such cases one or more differential amplifiers should be provided with corresponding voltage dividers having suitable dividing ratios.

What is claimed is:

1. An amplifier arrangement comprising at least two differential amplifiers having different gain factors and having their inputs coupled to one another and their outputs coupled to one another, at least the gain of the differential amplifier having the higher gain factor being variable, characterized in that a first resistor is connected between two inputs of the differential amplifier having the lower gain factor and in that a second resistor is connected between one input of said differential amplifier and a corresponding input of the other differential amplifier, and output means of the amplifier arrangement coupled to at least one pair of said coupled outputs.

2. An amplifier arrangement as claimed in claim 1, characterized in that the arrangement is preceded by a filter which is terminated by an impedance comprising the first and second resistor.

3. An amplifier arrangement as claimed in claim 2 wherein each differential amplifier comprises two emitter-coupled transistors each having a common emitter terminal, a source of direct current coupled to the common emitter terminal of each differential amplifier thereby to vary the gain of each differential amplifier by varying the direct current applied to its respective common emitter terminal, and means including a diode poled in the forward direction for coupling a collector of at least one of the transistors of the differential amplifier having the higher gain factor to a collector of the associated transistor of the other differential amplifier.

4. An amplifier arrangement as claimed in claim 3 further comprising first and second negative feedback resistors coupled between the respective emitters of the transistors of the differential amplifier having the lower gain factor and said source of direct current.

5. An ampliier arrangement as claimed in claim 1 characterized in that the differential amplifiers each comprise two emitter-coupled transistors having a common emitter terminal and the gain of each differential amplifier can be varied by varying a direct current applied to the common emitter terminal, and in that a collector of at least one of the transistors of the differential amplifier having the higher gain factor is coupled to the collector of the associated transistor of the other differential amplifier via a diode poled in the forward direction.

6. A circuit arrangement as claimed in claim 5, characterized in that negative-feedback resistors are connected to emitters of the transistors of the differential amplifier having the lower gain factor.

7. An amplifier arrangement as claimed in claim 1, wherein each differential amplifier comprises two emitter-coupled transistors each having a common emitter terminal, and a source of variable direct current coupled to the common emitter terminal of each differential amplifier thereby to vary the gain of each differential amplifier by varying the direct current applied to its respective common emitter terminal.

8. An amplifier arrangement as claimed in claim 7, further comprising firt and second negtive feedback resistors coupled between respective emitters of the transistors of the differential amplifier having the lower gain factor and said source of direct current, and means including a diode poled in the forward direction for coupling the output of at least one of the transistors of the differential amplifier having the higher gain factor to the output of the associated transistor of the other differential amplifier.

9. A variable gain amplifier apparatus comprising:
a first differential amplifier including first and second emitter-coupled transistors each transistor having an input and an output,
a second differential amplifier including third and fourth emitter-coupled transistors each transistor having an input and an output, said first and second differential amplifiers having different gain factors and with the gain of at least the differential amplifier with the higher gain factor being variable,
means for coupling the output of the first transistor to the output of the third transistor and the output of the second transistor to the output of the fourth transistor,
a first resistor connected between the inputs of the transistors of the differential amplifier having the lower gain factor,
a second resistor connected between the input of the first transistor and the input of the third transistor,
output means coupled to at least one pair of said coupled outputs of the first and second differenial amplifiers, and
means for applying an input signal to an input of at least one transistor of the differential amplifier having the higher gain factor.

10. A variable gain amplifier apparatus as claimed in claim 9, further comprising means for applying a variable DC current to a common emitter terminal of the first and second transistors and to a common emitter terminal of the third and fourth transistors thereby to vary the gain of each of said first and second differential amplifiers.

11. A variable gain amplifier apparatus as claimed in claim 10, further comprising first and second negative feedback resistors coupled between respective emitters of the transistors of the differential amplifier having the lower gain factor and the common emitter terminal of the transistors of the lower gain factor differential amplifier.

12. A variable gain amplifier apparatus as claimed in claim 11, wherein said means for coupling the outputs of the first and third transistors comprises a diode.

13. A variable gain amplifier apparatus as claimed in claim 12, wherein said means for coupling the outputs of the second and fourth transistors comprises a second diode, said apparatus further comprising a third resistor connected between the input of the second transistor and the input of the fourth transistor.

14. A variable gain amplifier apparatus as claimed in claim 13, wherein said means for applying a variable DC current comprises a third differential amplifier including fifth and sixth emitter-coupled transistors having respective outputs coupled to respective common emitter terminals of the first and second resistors and of the third and fourth transistors, and means for applying a variable control voltage to a control input of one of said fifth and sixth transistors thereby to vary the gain of said apparatus.

15. A variable gain amplifier apparatus as claimed in claim 10, wherein said means for applying a variable DC current comprises a third differential amplifier including fifth and sixth emitter-coupled transistors having respective outputs coupled to said respective common emitter terminals of the first and second transistors and of the third and fourth transistors, a source of constant current coupled to the coupled emitters of the fifth and sixth transistors, and
means for applying a variable control voltage to a control input of one of said fifth and sixth transistors thereby to vary the gain of said apparatus.

16. A variable gain amplifier apparatus as claimed in claim 10, further comprising a third resistor connected between the input of the second resistor and the input of the fourth transistor.

17. A variable gain amplifier apparatus as claimed in claim 9, further comprising first and second negative feedback resistors coupled between respective emitters of the transistors of the differential amplifier having the lower gain factor and the common emitter terminal of the transistors of the lower gain factor differential amplifier.

18. A variable gain amplifier apparatus as claimed in claim 17, wherein said output means comprises a first output terminal connected to said coupled outputs of the first and third transistors and a second output terminal connected to said coupled outputs of the second and fourth transistors, said apparatus further comprising means for applying a variable DC current to a common emitter terminal of the first and second transistors and to a common emitter terminal of the third and fourth transistors thereby to vary the gain of each of said first and second differential amplifiers.

* * * * *